(12) United States Patent
Chao et al.

(10) Patent No.: US 11,982,729 B2
(45) Date of Patent: May 14, 2024

(54) MOTOR INVERTER

(71) Applicant: Delta Electronics, Inc., Taoyuan (TW)

(72) Inventors: Kuo-Heng Chao, Taoyuan (TW); Yu-Kai Chang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 164 days.

(21) Appl. No.: 17/874,016

(22) Filed: Jul. 26, 2022

(65) Prior Publication Data

US 2023/0117130 A1 Apr. 20, 2023

Related U.S. Application Data

(60) Provisional application No. 63/256,189, filed on Oct. 15, 2021.

(30) Foreign Application Priority Data

Apr. 29, 2022 (CN) .......................... 202210472119.3

(51) Int. Cl.
  *G01R 35/00* (2006.01)
  *G01R 19/00* (2006.01)
  (Continued)

(52) U.S. Cl.
  CPC ......... *G01R 35/00* (2013.01); *G01R 19/0038* (2013.01); *G01R 31/2837* (2013.01);
  (Continued)

(58) Field of Classification Search
  CPC ................ G01R 35/00; G01R 19/0038; G01R 31/2837; G01R 31/2839; H02H 1/0007;
  (Continued)

(56) References Cited

U.S. PATENT DOCUMENTS 9,889,880 B2 * 2/2018 Mori ......................... B60L 3/12
10,886,867 B2 1/2021 Saha et al.
2018/0062557 A1 3/2018 Tao et al.

FOREIGN PATENT DOCUMENTS

CN 107458231 A 12/2017
CN 110098779 A 8/2019
(Continued)

*Primary Examiner* — David Luo
(74) *Attorney, Agent, or Firm* — KIRTON McCONKIE; Evan R. Witt (57) ABSTRACT

A motor inverter is provided. The motor inverter is coupled to an input power source and a motor and controls the mechanical switch to receive or turn off the input power source. The motor inverter includes primary and secondary auxiliary circuits, a microprocessor, a gate driver, and a motor drive circuit. The primary and secondary auxiliary circuits are coupled to the input power source and outputs first and second output voltages respectively. The microprocessor operates the driving switches of the motor drive circuit through the gate driver to switch the input power source for driving the motor. If the microprocessor determines that the first output voltage is abnormal and the motor rotational speed exceeds a safe speed limit, the microprocessor controls the driving switches to form an active short circuit for stopping the motor, and the microprocessor turns off the mechanical switch for protecting the input power source.

14 Claims, 5 Drawing Sheets

(51) Int. Cl.
    *G01R 31/28*     (2006.01)
    *H02H 1/00*     (2006.01)
    *H02H 3/04*     (2006.01)
    *H02H 3/10*     (2006.01)
    *H02H 7/08*     (2006.01)
    *H02K 11/33*     (2016.01)
    *H02P 6/182*     (2016.01)
    *H02P 6/20*     (2016.01)
    *H02P 6/24*     (2006.01)
    *H02P 27/06*     (2006.01)
    *H03K 17/081*     (2006.01)
    *H03K 17/687*     (2006.01)

(52) U.S. Cl.
    CPC ....... *G01R 31/2839* (2013.01); *H02H 1/0007* (2013.01); *H02H 3/044* (2013.01); *H02H 3/10* (2013.01); *H02H 7/08* (2013.01); *H02K 11/33* (2016.01); *H02P 6/20* (2013.01); *H02P 6/24* (2013.01); *H02P 27/06* (2013.01); *H03K 17/08104* (2013.01); *H03K 17/687* (2013.01); *H02P 6/182* (2013.01)

(58) Field of Classification Search
    CPC ............ H02H 3/044; H02H 3/10; H02H 7/08; H02K 11/33; H02K 3/18; H02P 6/20; H02P 6/24; H02P 27/06; H02P 6/182; H03K 17/08104; H03K 17/687
    USPC .......................... 318/3, 400.26, 400.01, 700
    See application file for complete search history.

(56) References Cited

FOREIGN PATENT DOCUMENTS

| | | |
|---|---|---|
| TW | 200428750 A | 12/2004 |
| TW | 200941917 A | 10/2009 |
| TW | 201006119 A | 2/2010 |
| TW | 202044744 A | 12/2020 |

\* cited by examiner

MOTOR INVERTER

CROSS-REFERENCE TO RELATED APPLICATION

This application claims the benefit of U.S. Provisional Application No. 63/256,189 filed on Oct. 15, 2021, and entitled "TROUBLESHOOTING METHOD AND OVERCURRENT PROTECTION SYSTEM FOR CURRENT SENSOR AND SAFETY MECHANISM FOR ABNORMAL POWER SUPPLY". This application also claims priority to China Patent Application No. 202210472119.3 filed on Apr. 29, 2022. The entire contents of the above-mentioned patent applications are incorporated herein by reference for all purposes.

FIELD OF THE INVENTION

The present disclosure relates to a motor inverter, and more particularly to a motor inverter applied to an on-board permanent magnet motor.

BACKGROUND OF THE INVENTION

When the permanent magnet motor is used in the on-board applications, the back EMF (electromotive force) of the permanent magnet motor is higher than the battery voltage under high-speed operation of the permanent magnet motor. Accordingly, the energy generated by the back EMF would be returned to the battery through the body diode of MOSFET (metal-oxide-semiconductor field-effect transistor), which may damage the battery. Moreover, in addition to damaging the battery, the energy generated by the back EMF may cause negative torque output to the vehicle and make the motor brake. Meanwhile, if the relay of the battery is turned off for protecting the battery, the motor driver would be damaged by the energy generated by the back EMF, which has nowhere to go.

In the conventional motor control method, in order to prevent the energy backflow caused by the back EMF, the controller performs an active short circuit to the motor driver to form a discharging loop in the motor driver for releasing the energy generated by the back EMF. The active short circuit must be actively performed by the controller or the control chip and cannot be completed by simply cutting off the power. However, in the on-board applications, when the controller performs the active short circuit to the motor driver, the sudden or unexpected braking occurrence of the vehicle usually happens and hurts the passenger.

Therefore, for avoiding the unexpected braking occurrence caused by the conventional active short circuit, the present disclosure provides a motor inverter capable of utilizing the auxiliary circuit to switch the motor driver to form the active short circuit in order to overcome the drawbacks of the conventional technologies.

SUMMARY OF THE INVENTION

The present disclosure provides a motor inverter. The active short circuit is performed through switching to the auxiliary circuit, and the mechanical switch is turned off after the active short circuit is formed for stopping the input power source supplying power to the motor. Consequently, the motor is stopped, the energy backflow is avoided, and thus the battery is prevented from being damaged by the energy backflow.

In accordance with an aspect of the present disclosure, a motor inverter is provided. The motor inverter is coupled to an input power source and a motor. The input power source has a mechanical switch, and the motor inverter controls the mechanical switch to receive or turn off the input power source. The motor inverter includes a primary auxiliary circuit, a secondary auxiliary circuit, a first diode, a second diode, a power control system, a motor drive circuit, and an encoder. The primary auxiliary circuit is coupled to the input power source and outputs a first output voltage. The secondary auxiliary circuit is coupled to the input power source and outputs a second output voltage. The first output voltage is greater than the second output voltage. An anode terminal of the first diode is connected to the first output voltage, an anode terminal of the second diode is connected to the second output voltage, and cathode terminals of the first and second diodes are connected together to form a common point. The power control system includes a microprocessor and a gate driver. The microprocessor is coupled to the anode terminal of the first diode to receive the first output voltage, and the microprocessor determines whether the first output voltage is abnormal. The motor drive circuit includes a plurality of driving switches. The microprocessor operates the plurality of driving switches through the gate driver so that the plurality of driving switches switch the input power source to drive the motor. The encoder is coupled to the motor, and the microprocessor determines a motor rotational speed of the motor through the encoder. If the microprocessor determines that the first output voltage is abnormal, the microprocessor determines whether the motor rotational speed exceeds a safe speed limit. If the microprocessor determines that the motor rotational speed exceeds the safe speed limit, the microprocessor controls the plurality of driving switches to form an active short circuit through the gate driver for stopping the motor, and the microprocessor turns off the mechanical switch for protecting the input power source.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
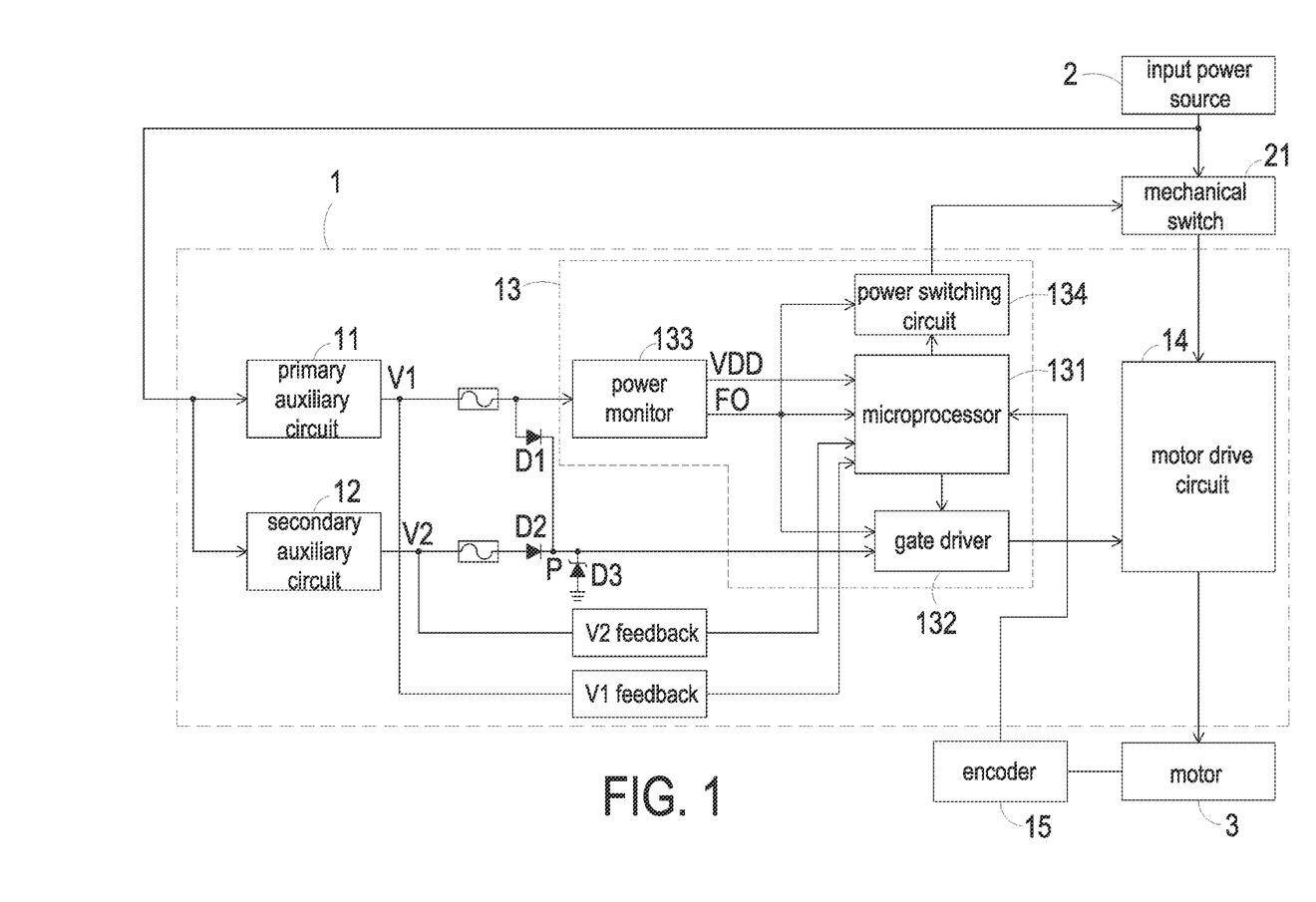
FIG. 1 is schematic block diagram illustrating a motor inverter, an input power source, and a motor according to an embodiment of the present disclosure.

FIG. 1 is schematic block diagram illustrating a motor inverter, an input power source, and a motor according to an embodiment of the present disclosure. As shown in FIG. 1, the motor inverter 1 is coupled to the input power source 2 and the motor 3. The input power source 2 has a mechanical switch 21 (e.g., a relay), and the motor inverter 1 controls the mechanical switch 21 to receive or turn off the input power source 2. The motor inverter 1 includes a primary auxiliary circuit 11, a secondary auxiliary circuit 12, a first diode D1, a second diode D2, a power control system 13, a motor drive circuit 14, and an encoder 15. In an embodiment, the motor inverter 1 includes the encoder 15, or the encoder 15 is disposed outside the motor inverter 1, but not limited thereto. The primary auxiliary circuit 11 is coupled to the input power source 2 and outputs a first output voltage V1. The secondary auxiliary circuit 12 is coupled to the input power source 2 and outputs a second output voltage V2. The first output voltage V1 is greater than the second output voltage V2. An anode terminal of the first diode D1 is connected to the first output voltage V1, an anode terminal of the second diode D2 is connected to the second output voltage V2, and cathode terminals of the first diode D1 and the second diode D2 are connected together to form a common point P. The power control system 13 includes a microprocessor 131 and a gate driver 132. The microprocessor 131 is coupled to the anode terminal of the first diode D1 to receive the first output voltage V1. The gate driver 132 is coupled to the common point P. The motor drive circuit 14 includes a plurality of driving switches and is coupled to the mechanical switch 21, the motor 3, and the gate driver 132. The microprocessor 131 operates all the driving switches through the gate driver 132 so that all the driving switches switch the input power source to drive the motor 3. The encoder 15 is coupled to the motor 3 and the microprocessor 131, and the microprocessor 131 determines a motor rotational speed of the motor 3 through the encoder 15. In an embodiment, the input power source 2 is a battery applied in the vehicle and motorcycle, but not limited thereto.

Since the first output voltage V1 is greater than the second output voltage V2, under normal condition, the first diode D1 is turned on, the second diode D2 is in the reverse cut-off state, and the gate driver 132 is powered by the first output voltage V1. When the first output voltage V1 fails and becomes lower than the second output voltage V2, the first diode D1 is in the reverse cut-off state, the second diode D2 is turned on, and the gate driver 132 is powered by the second output voltage V2. In an embodiment, the motor inverter 1 further includes a third diode D3. When the first output voltage V1 fails due to overvoltage, the voltage supplied to the gate driver 132 is clamped by the third diode D3, thereby forcing the fuse connected between the primary auxiliary circuit 11 and the first diode D1 to blow.

Figure 2:
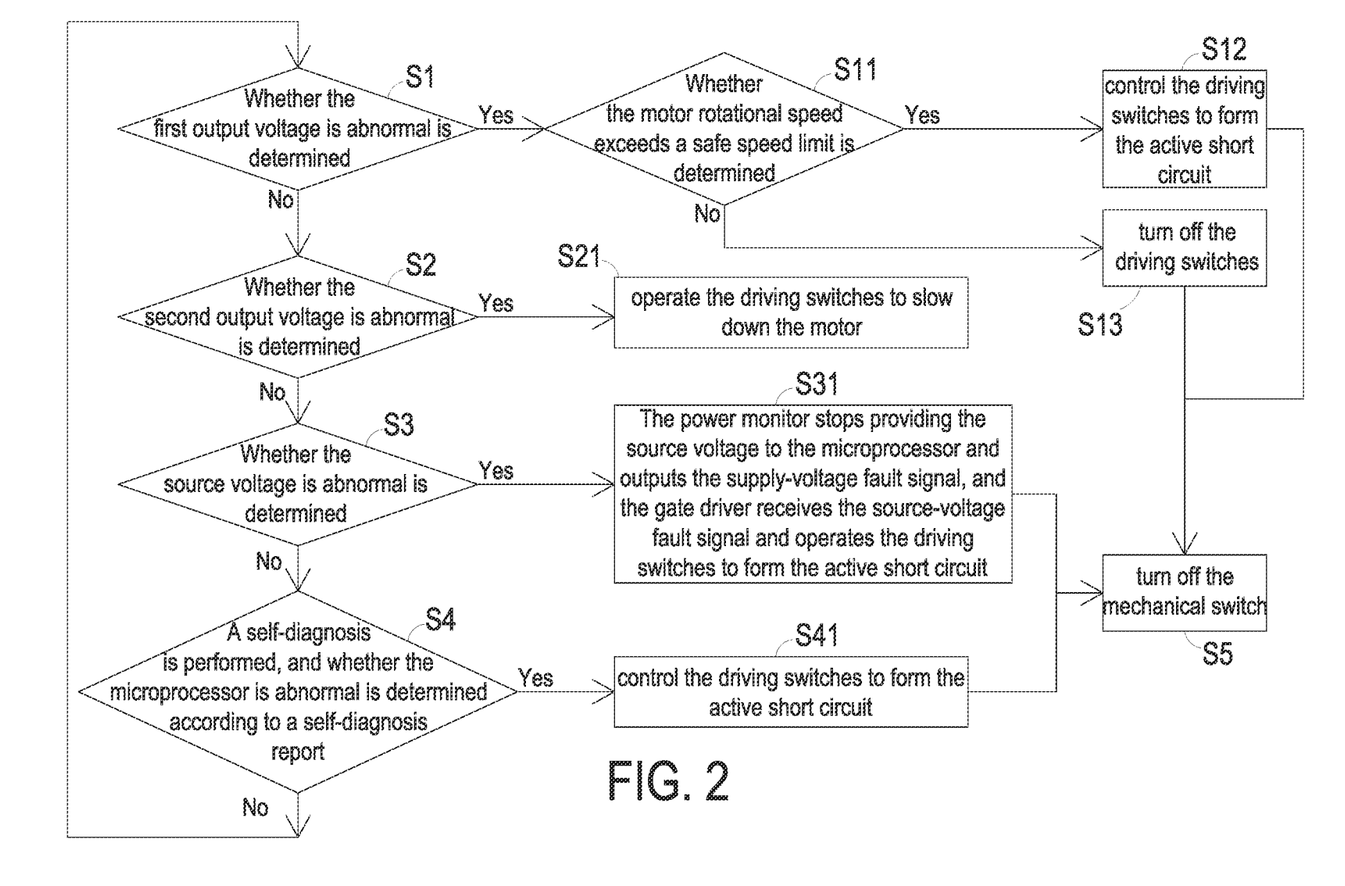
FIG. 2 is a schematic flow chart showing the operation of the motor inverter of FIG. 1.

FIG. 2 is a schematic flow chart showing the operation of the motor inverter of FIG. 1. The operation of the motor inverter 1 would be described below according to FIG. 1 and FIG. 2. As shown in FIG. 1 and FIG. 2, firstly, in step S1, the microprocessor 131 determines whether the first output voltage V1 is abnormal. If the microprocessor 131 determines that the first output voltage V1 is abnormal, the microprocessor 131 determines whether the motor rotational speed exceeds a safe speed limit (step S11). If the microprocessor 131 determines that the motor rotational speed exceeds the safe speed limit, the microprocessor 131 controls all the driving switches to form the active short circuit (step S12) through the gate driver 132 for stopping the torque output of the motor 3, and the microprocessor 131 turns off the mechanical switch 21 (step S5) for disconnecting and protecting the input power source 2. On the other hand, if the microprocessor 131 determines that the motor rotational speed is lower than the safe speed limit, the microprocessor 131 turns off all the driving switches (step S13) through the gate driver 132 for stopping the torque output of the motor 3, and the microprocessor 131 turns off the mechanical switch 21 (step S5) for disconnecting and protecting the input power source 2.

Consequently, the motor inverter 1 of the present disclosure performs the active short circuit through switching to the auxiliary circuit, and the mechanical switch 21 is turned off after the active short circuit is formed for stopping the input power source 2 supplying power to the motor 3. Consequently, the motor 3 is stopped, the energy backflow is avoided, and thus the battery is prevented from being damaged by the energy backflow.

Please continue referring to FIG. 1 and FIG. 2. In an embodiment, the microprocessor 131 is coupled to the anode terminal of the second diode D2 to receive the second output voltage V2. In the above-mentioned step S1, if the microprocessor 131 determines that the first output voltage V1 is normal, the microprocessor 131 further performs step S2 to determine whether the second output voltage V2 is abnormal. If the microprocessor 131 determines that the second output voltage V2 is abnormal, the microprocessor 131 operates all the driving switches through the gate driver 132 to slow down the motor 3 (step S21).

In an embodiment, the power control system 13 further includes a power monitor 133. The power monitor 133 is coupled to the anode terminal of the first diode D1 and receives the first output voltage V1 to generate a source voltage VDD for the microprocessor 131. The power monitor 133 outputs a source-voltage fault signal FO when the source voltage VDD is abnormal. In an embodiment, the microprocessor 131 includes a power switching circuit 134, and the microprocessor 131 turns on or off the mechanical switch 21 through controlling the power switching circuit 134. Moreover, the power switching circuit 134 may further receive the source-voltage fault signal FO to turn off the mechanical switch 21. In another embodiment, the power switching circuit 134 may be disposed outside the microprocessor 131, and the power switching circuit 134 directly receives the source-voltage fault signal FO to turn off the mechanical switch 21.

In the above-mentioned step S2, if the microprocessor 131 determines that the second output voltage V2 is normal, the power monitor 133 performs step S3 to do self-detection and determine whether the source voltage VDD is abnormal. If the power monitor 133 determines that the source voltage VDD is abnormal (i.e., the power monitor 133 is abnormal), the power monitor 133 stops providing the source voltage VDD to the microprocessor 131, and the power monitor 133 outputs the source-voltage fault signal FO. The gate driver 132 receives the source-voltage fault signal FO and operates all the driving switches to form the active short circuit (step S31), and the power switching circuit 134 receives the source-voltage fault signal FO to turn off the mechanical switch 21 (step S5).

In an embodiment, in the above-mentioned step S3, if the power monitor 133 determines that the source voltage VDD is normal, the microprocessor 131 further performs step S4. In the step S4, the microprocessor 131 performs a self-diagnosis, and determines whether the microprocessor 131 is abnormal according to a self-diagnosis report. If the microprocessor 131 determines that the microprocessor 131 is abnormal (for example but not limited to the failure of an internal power source of the microprocessor 131) according to the self-diagnosis report, the microprocessor 131 controls all the driving switches to form the active short circuit through the gate driver 132 (step S41) for stopping the torque output of the motor 3, and the microprocessor 131 turns off the mechanical switch 21 (step S5) for disconnecting and protecting the input power source 2. If the microprocessor 131 determines that the microprocessor 131 is normal according to the self-diagnosis report, the microprocessor 131 performs the step S1 again. During the operation of the motor inverter 1, the microprocessor 131 continuously performs the steps S1 to S4 in a loop to check if any voltage is abnormal.

In the above embodiments, it is noted that the voltage (such as the first output voltage V1, the second output voltage V2, the source voltage VDD, and the internal power source of the microprocessor 131) being normal means that the voltage meets a preset value and doesn't exceed an allowable error range. On the contrary, the voltage being abnormal means that the voltage exceeds the allowable error range.

In addition, in the present disclosure, when the mechanical switch 21 is turned off, the mechanical switch 21 is completely turned off after a mechanical response time (e.g., 1 ms). Therefore, the input power source 2 stops supplying power to the motor drive circuit 14 after the active short circuit is formed. In other words, due to a certain mechanical response time of the mechanical switch 21, when the mechanical switch 21 receives a control signal from the microprocessor 131 or the power switching circuit 134, the mechanical switch 21 is actually turned off after the mechanical response time. Accordingly, the mechanical switch 21 is ensured to be turned off after the active short circuit is formed, and thus the input power source 2 is ensured to be turned off after the active short circuit is formed. Consequently, the backflow of the back EMF of the motor 3 is avoided, and the circuit and battery are prevented from being damaged by the backflow. The advantage of this design is that the input power source is ensured to be turned off after the active short circuit is formed without disposing any additional delay circuit, which can reduce the design cost and the product volume.

Figure 3:
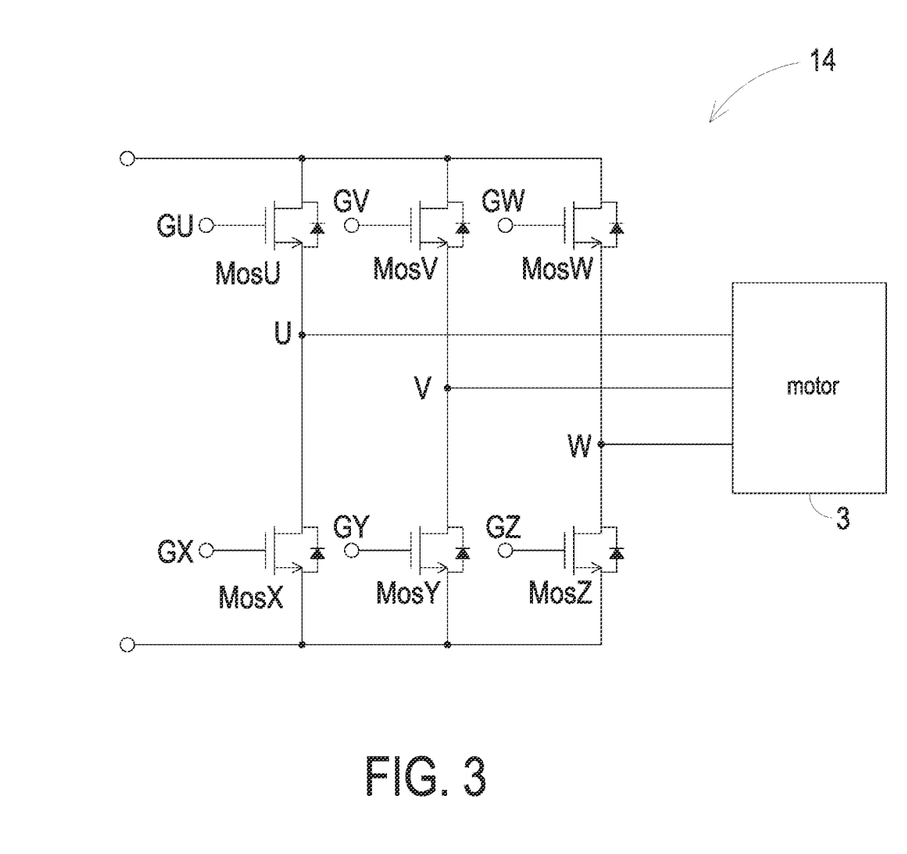
FIG. 3 is schematic circuit diagram illustrating the motor drive circuit of FIG. 1.

FIG. 3 is schematic circuit diagram illustrating the motor drive circuit of FIG. 1. In an embodiment, as shown in FIG. 3, the driving switches of the motor drive circuit 14 include a plurality of upper-bridge transistors MosU, MosV, and MosW and a plurality of lower-bridge transistors MosX, MosY, and MosZ. The first terminals of all the upper-bridge transistors MosU, MosV, and MosW are connected to a high voltage level of the input power source 2. The first terminals of the lower-bridge transistors MosX, MosY, and MosZ are connected to the second terminals of the upper-bridge transistors MosU, MosV, and MosW respectively. The second terminals of all the lower-bridge transistors MosX, MosY, and MosZ are connected to a low voltage level of the input power source 2. A node U is connected between the second terminal of the upper-bridge transistor MosU and the first terminal of the lower-bridge transistor MosX. A node V is connected between the second terminal of the upper-bridge transistor MosV and the first terminal of the lower-bridge transistor MosY. A node W is connected between the second terminal of the upper-bridge transistor MosW and the first terminal of the lower-bridge transistor MosZ. The nodes U, V, and W are respectively connected to the motor 3. In addition, the gate terminals of the upper-bridge transistors MosU, MosV, and MosW are GU, GV, and GW respectively, and the gate terminals of the lower-bridge transistors MosX, MosY, and MosZ are GX, GY, and GZ respectively.

In an embodiment, the gate driver 132 includes a plurality of upper and lower bridge control circuits. Each upper and lower bridge control circuit is connected to the common point P and controls one of the upper-bridge transistors and one of the lower-bridge transistors. Taking the motor drive circuit 14 shown in FIG. 3 as an example, the gate driver 132 may include three upper and lower bridge control circuits. The first upper and lower bridge control circuit controls the upper-bridge transistor MosU and the lower-bridge transistor MosX. The second upper and lower bridge control circuit controls the upper-bridge transistor MosV and the lower-bridge transistor MosY. The third upper and lower bridge control circuit controls the upper-bridge transistor MosW and the lower-bridge transistor MosZ. In addition, in an embodiment, in the flow chart shown in FIG. 2, when the power monitor 133 determines that the source voltage VDD is abnormal and stops providing the source voltage VDD to the microprocessor 131, the power monitor 133 outputs the source-voltage fault signal FO to every upper and lower bridge control circuit for turning off all the upper-bridge transistors MosU, MosV, and MosW and turning on all the lower-bridge transistors MosX, MosY, and MosZ.

Figure 4:
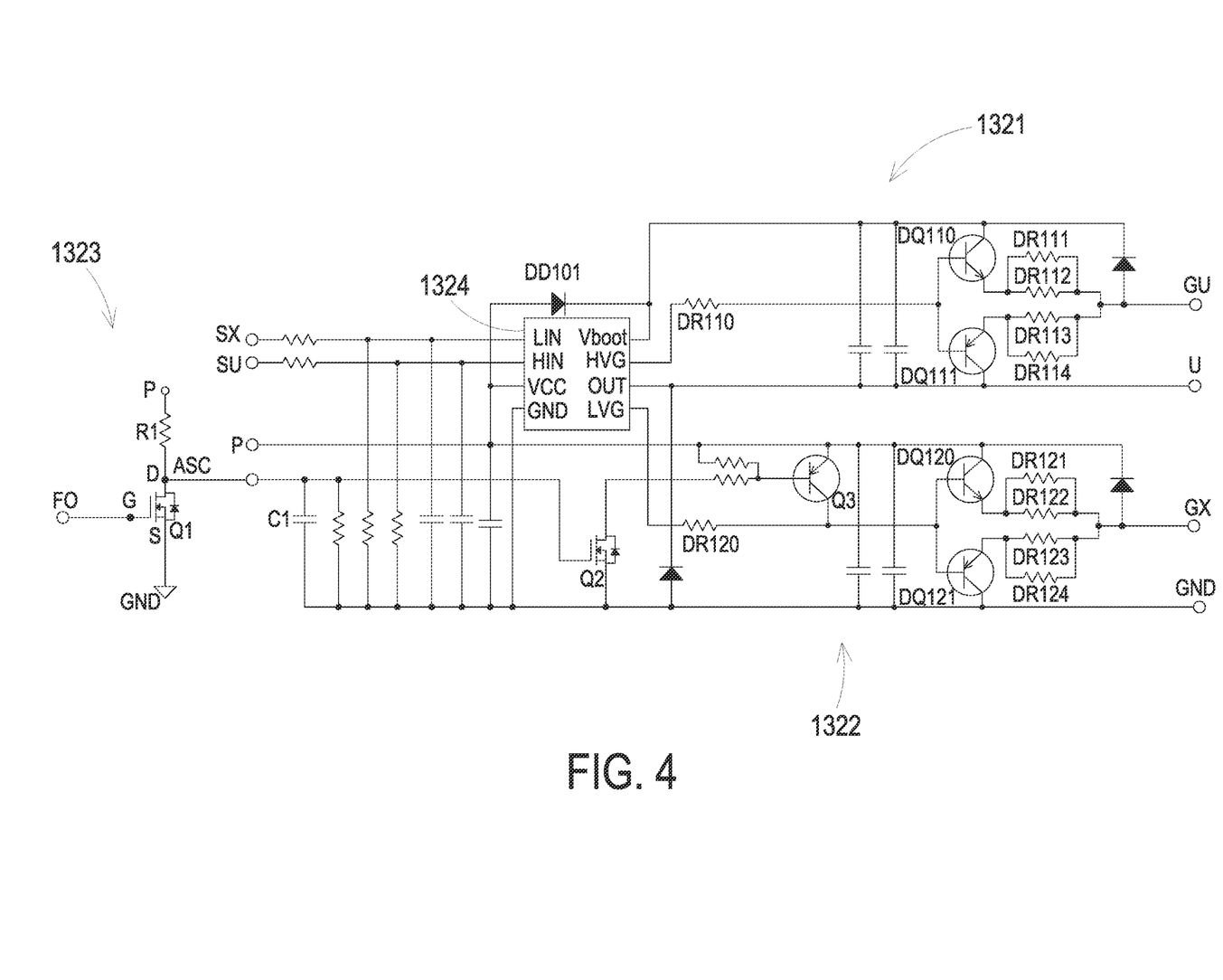
FIG. 4 is a schematic circuit diagram illustrating an upper and lower bridge control circuit which controls the upper-bridge transistor MosU and the lower-bridge transistor MosX of FIG. 3.

FIG. 4 is a schematic circuit diagram illustrating an upper and lower bridge control circuit which controls the upper-bridge transistor MosU and the lower-bridge transistor MosX of FIG. 3. Since the circuit structure of every upper and lower bridge control circuit is similar, the circuit structure of the upper and lower bridge control circuit is exemplified in FIG. 4. In an embodiment, as shown in FIG. 4, the upper and lower bridge control circuit includes an upper-bridge control circuit 1321, a lower-bridge control circuit 1322, a delay circuit 1323, and a controller 1324. The upper-bridge control circuit 1321 is used to control the corresponding upper-bridge transistor MosU, and the lower-bridge control circuit 1322 is used to control the corresponding lower-bridge transistor MosX. The delay circuit 1323 is connected to the source-voltage fault signal FO, the common point P, and the lower-bridge control circuit 1322. The controller 1324 is coupled to the microprocessor 131, and the microprocessor 131 operates the upper-bridge control circuit 1321 and the lower-bridge control circuit 1322 through the controller 1324. In FIG. 4, SX and SU are control signals from the microprocessor 131.

When the power monitor 133 determines that the source voltage VDD is abnormal and stops providing the source voltage VDD to the microprocessor 131, the controller 1324 stops operating the upper-bridge control circuit 1321 and the lower-bridge control circuit 1322. When the delay circuit 1323 receives the source-voltage fault signal FO, the delay circuit 1323 receives the first output voltage V1 or the second output voltage V2 through the common point P and outputs an active-short-circuit signal ASC. After the controller 1324 stops operating the upper-bridge control circuit 1321 and the lower-bridge control circuit 1322, the active-short-circuit signal ASC constantly turns on the corresponding lower-bridge transistor MosX through the lower-bridge control circuit 1322.

Since the delay circuit 1323 delays the active-short-circuit signal ASC, actually the lower-bridge transistor MosX is turned on after the upper-bridge transistor MosU is turned off. Therefore, when the lower-bridge transistor MosX is turned on, the upper-bridge transistor MosU is prevented from being damaged by the current backflow.

In an embodiment, as shown in FIG. 4, the delay circuit 1323 includes an active resistor R1, an active transistor Q1, and an active capacitor C1. A first terminal of the active resistor R1 is coupled to the common point P. A gate terminal G of the active transistor Q1 is coupled to the source-voltage fault signal FO, a drain terminal D of the active transistor Q1 is connected to a second terminal of the active resistor R1, and a source terminal S of the active transistor Q1 is grounded. One terminal of the active capacitor C1 is coupled to the drain terminal D of the active transistor Q1 and the lower-bridge control circuit 1322, and the other terminal of the active capacitor C1 is grounded. When the source-voltage fault signal FO turns off the active transistor Q1, the first output voltage V1 or the second output voltage V2 flows through the active resistor R1 to form the active-short-circuit signal ASC. The active-short-circuit signal ASC flows into the active capacitor C1 and the lower-bridge control circuit 1322 to turn on the corresponding lower-bridge transistor MosX.

In FIG. 4, when the control signal SU is at high level, a potential between a pin HVG of the controller 1324 and the node U is equal to the voltage on the common point P minus the voltage drop of the diode DD101. Through the current-limiting resistor DR110, the transistor DQ110 is turned on and the transistor DQ111 is turned off. After the transistor DQ110 is turned on, the gate terminal GU is driven to high voltage level through the gate resistors DR111 and DR112. A potential between the gate terminal GU and the node U is equal to the voltage on the common point P minus the voltage drop of the diode DD101 and the turn-on voltage drop of the transistor DQ110.

When the control signal SU is at low level, the potential between the pin HVG of the controller 1324 and the node U is equal to 0V. Through the current-limiting resistor DR110, the transistor DQ111 is turned on and the transistor DQ110 is turned off. After the transistor DQ111 is turned on, the gate terminal GU is driven to low voltage level through the gate resistors DR113 and DR114. The potential between the gate terminal GU and the node U is equal to the turn-on voltage drop of the transistor DQ111.

When the control signal SX is at high level, a potential between a pin LVG and a pin GND of the controller 1324 is equal to the voltage on the common point P. Through the current-limiting resistor DR120, the transistor DQ120 is turned on and the transistor DQ121 is turned off. After the transistor DQ120 is turned on, the gate terminal GX is driven to high voltage level through the gate resistors DR121 and DR122. A potential between the gate terminal GX and the pin GND is equal to the voltage on the common point P minus the turn-on voltage drop of the transistor DQ120.

When the control signal SX is at low level, the potential between the pin LVG and the pin GND of the controller 1324 is equal to 0V. Through the current-limiting resistor DR120, the transistor DQ121 is turned on and the transistor DQ120 is turned off. After the transistor DQ121 is turned on, the gate terminal GX is driven to low voltage level through the gate resistors DR123 and DR124. The potential between the gate terminal GX and the pin GND is equal to the turn-on voltage drop of the transistor DQ121.

When the source voltage VDD is abnormal, the control signals SU and SX decreases to 0V, the potential between the pin HVG of the controller 1324 and the node U decreases to 0V, and the potential between the pins LVG and GND of the controller 1324 decreases to 0V. The power monitor 133 outputs the source-voltage fault signal FO, and the delay circuit 1323 receives the source-voltage fault signal FO and outputs the active-short-circuit signal ASC. The active-short-circuit signal ASC drives and turns on the transistor Q2, and then the transistor Q3 is turned on. After the transistor Q3 is turned on, the transistors DQ120 and DQ121 are forcibly turned on and off respectively. After the transistor DQ120 is turned on, the gate terminal GX is driven to high voltage level through the gate resistors DR121 and DR122, thereby realizing the active short circuit.

Figure 5:
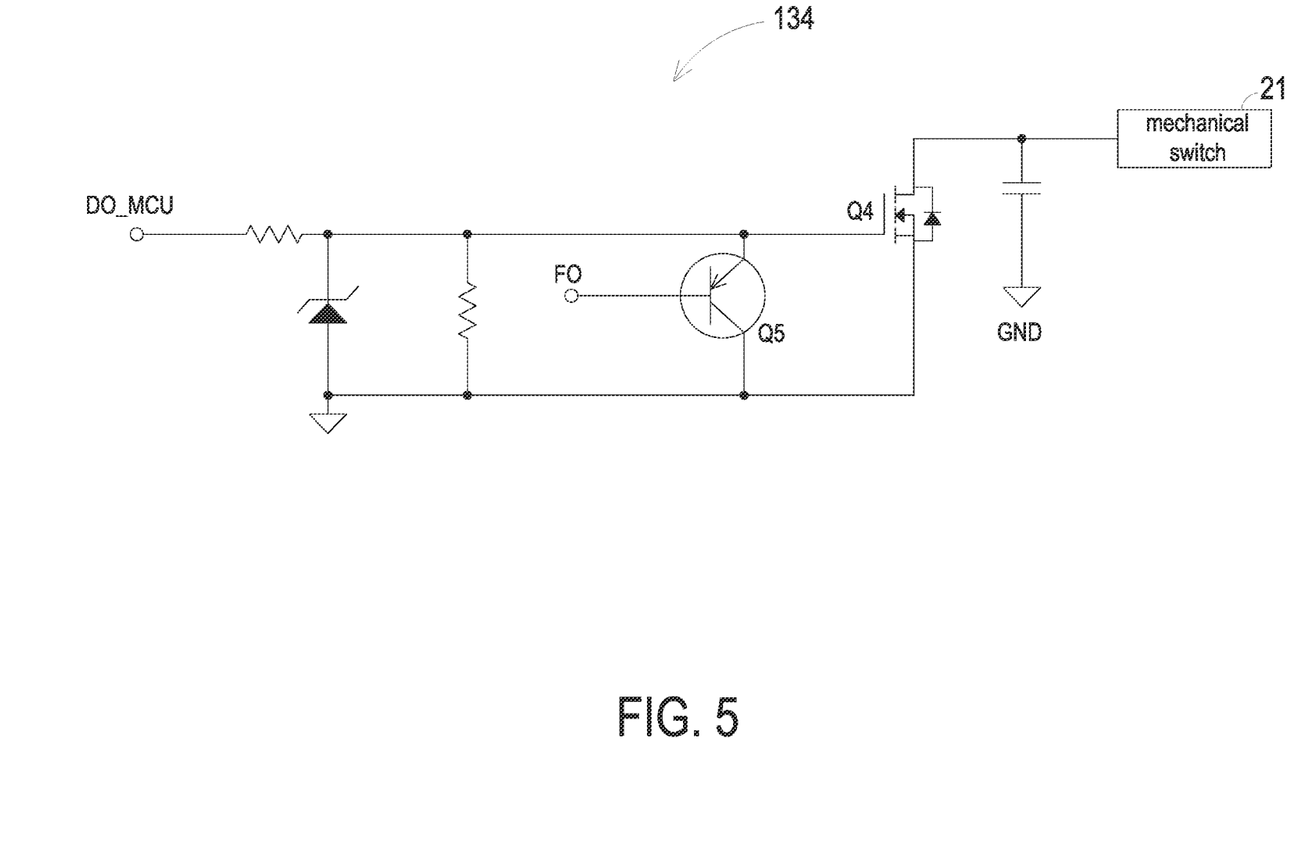
FIG. 5 is a schematic circuit diagram illustrating the power switching circuit of FIG. 1.

FIG. 5 is a schematic circuit diagram illustrating the power switching circuit of FIG. 1. As shown in FIG. 5, DO_MCU is a control signal from the microprocessor 131, and the power switching circuit 134 includes transistors Q4 and Q5. When the control signal DO_MCU is at high level, the transistor Q4 is turned on, and then the mechanical switch 21 is driven to turn on. When the transistor Q5 receives the source-voltage fault signal FO, the transistor Q5 is driven to forcibly decrease the gate potential of the transistor Q4 to low voltage level. Accordingly, the transistor Q4 is turned off, and then the mechanical switch 21 is turned off.

In summary, the present disclosure provides a motor inverter. The active short circuit is performed through switching to the auxiliary circuit, and the mechanical switch is turned off after the active short circuit is formed for stopping the input power source supplying power to the motor. Consequently, the motor is stopped, the energy backflow is avoided, and thus the battery is prevented from being damaged by the energy backflow.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A motor inverter, coupled to an input power source and a motor, wherein the input power source has a mechanical switch, the motor inverter controls the mechanical switch to receive or turn off the input power source, and the motor inverter comprises:
a primary auxiliary circuit, coupled to the input power source and outputting a first output voltage;
a secondary auxiliary circuit, coupled to the input power source and outputting a second output voltage, wherein the first output voltage is greater than the second output voltage;
a first diode and a second diode, wherein an anode terminal of the first diode is connected to the first output voltage, an anode terminal of the second diode is connected to the second output voltage, and cathode terminals of the first and second diodes are connected together to form a common point;
a power control system, comprising a microprocessor and a gate driver, wherein the microprocessor is coupled to the anode terminal of the first diode to receive the first output voltage, and the microprocessor determines whether the first output voltage is abnormal;
a motor drive circuit, comprising a plurality of driving switches, wherein the microprocessor operates the plurality of driving switches through the gate driver so that the plurality of driving switches switch the input power source to drive the motor; and an encoder, coupled to the motor, wherein the microprocessor determines a motor rotational speed of the motor through the encoder, wherein if the microprocessor determines that the first output voltage is abnormal, the microprocessor determines whether the motor rotational speed exceeds a safe speed limit, wherein if the microprocessor determines that the motor rotational speed exceeds the safe speed limit, the microprocessor controls the plurality of driving switches to form an active short circuit through the gate driver for stopping the motor, and the microprocessor turns off the mechanical switch for protecting the input power source.

2. The motor inverter according to claim 1, wherein if the microprocessor determines that the motor rotational speed is lower than the safe speed limit, the microprocessor turns off the plurality of driving switches through the gate driver for stopping the motor, and the microprocessor turns off the mechanical switch for protecting the input power source.

3. The motor inverter according to claim 1, wherein the microprocessor is coupled to the anode terminal of the second diode to receive the second output voltage;

wherein after the microprocessor determines that the first output voltage is normal, the microprocessor determines whether the second output voltage is abnormal.

4. The motor inverter according to claim 3, wherein if the microprocessor determines that the second output voltage is abnormal, the microprocessor operates the plurality of driving switches through the gate driver to slow down the motor.

5. The motor inverter according to claim 3, wherein the power control system further comprises a power monitor, and the power monitor is coupled to the anode terminal of the first diode and receives the first output voltage to generate a source voltage for the microprocessor;

wherein after the microprocessor determines that the second output voltage is normal, the power monitor performs self-detection to determine whether the source voltage is abnormal.

6. The motor inverter according to claim 5, wherein if the power monitor determines that the source voltage is abnormal, the power monitor stops providing the source voltage to the microprocessor, and the power monitor outputs a source-voltage fault signal;

wherein the gate driver receives the source-voltage fault signal and operates the plurality of driving switches to form the active short circuit.

7. The motor inverter according to claim 6, wherein the plurality of driving switches comprises a plurality of upper-bridge transistors and a plurality of lower-bridge transistors;

wherein first terminals of the plurality of upper-bridge transistors are connected to a high voltage level of the input power source, first terminals of the plurality of lower-bridge transistors are connected to second terminals of the plurality of upper-bridge transistors respectively, and second terminals of the plurality of lower-bridge transistors are connected to a low voltage level of the input power source;

wherein the gate driver comprises a plurality of upper and lower bridge control circuits, and each of the plurality of upper and lower bridge control circuits is connected to the common point and controlling corresponding one of the plurality of upper-bridge transistors and corresponding one of the plurality of lower-bridge transistors.

8. The motor inverter according to claim 7, wherein when the power monitor stops providing the source voltage to the microprocessor, the power monitor outputs the source-voltage fault signal to the plurality of upper and lower bridge control circuits for turning off the plurality of upper-bridge transistors and turning on the plurality of lower-bridge transistors.

9. The motor inverter according to claim 8, wherein each of the plurality of upper and lower bridge control circuits comprises:

an upper-bridge control circuit, configured to control the corresponding upper-bridge transistor;

a lower-bridge control circuit, configured to control the corresponding lower-bridge transistor;

a delay circuit, connected to the source-voltage fault signal, the common point, and the lower-bridge control circuit; and a controller, coupled to the microprocessor, wherein the microprocessor controls the upper-bridge control circuit and the lower-bridge control circuit through the controller;

wherein when the power monitor stops providing the source voltage to the microprocessor, the controller stops operating the upper-bridge control circuit and the lower-bridge control circuit;

wherein when the delay circuit receives the source-voltage fault signal, the delay circuit receives the first output voltage or the second output voltage through the common point and outputs an active-short-circuit signal;

wherein after the controller stops operating the upper-bridge control circuit and the lower-bridge control circuit, the active-short-circuit signal constantly turns on the corresponding lower-bridge transistor through the lower-bridge control circuit.

10. The motor inverter according to claim 9, wherein the delay circuit comprises:

an active resistor, wherein a first terminal of the active resistor is coupled to the common point;

an active transistor, wherein a gate terminal of the active transistor is coupled to the source-voltage fault signal, and a drain terminal of the active transistor is connected to a second terminal of the active resistor; and an active capacitor, wherein a terminal of the active capacitor is coupled to the drain terminal of the active transistor and the lower-bridge control circuit;

wherein when the source-voltage fault signal turns off the active transistor, the first output voltage or the second output voltage flows through the active resistor to form the active-short-circuit signal;

wherein the active-short-circuit signal flows into the active capacitor and the lower-bridge control circuit to turn on the corresponding lower-bridge transistor.

11. The motor inverter according to claim 10, wherein the microprocessor comprises a power switching circuit, and the power switching circuit receives the source-voltage fault signal to turn off the mechanical switch.

12. The motor inverter according to claim 11, wherein when mechanical switch is turned off, the mechanical switch is completely turned off after a mechanical response time so that the input power source stops supplying power to the motor drive circuit after the active short circuit is formed.

13. The motor inverter according to claim 5, wherein after the power monitor determines that the source voltage is normal, the microprocessor performs a self-diagnosis and determines whether the microprocessor is abnormal according to a self-diagnosis report;

wherein if the microprocessor determines that the microprocessor is abnormal according to the self-diagnosis report, the microprocessor controls the plurality of driving switches to form the active short circuit through the gate driver for stopping the motor, and the microprocessor turns off the mechanical switch for protecting the input power source.

14. The motor inverter according to claim 1, wherein when mechanical switch is turned off, the mechanical switch is completely turned off after a mechanical response time so that the input power source stops supplying power to the motor drive circuit after the active short circuit is formed.

* * * * *